United States Patent
Siemieniec et al.

(10) Patent No.: US 11,342,433 B2
(45) Date of Patent: May 24, 2022

(54) SILICON CARBIDE DEVICES, SEMICONDUCTOR DEVICES AND METHODS FOR FORMING SILICON CARBIDE DEVICES AND SEMICONDUCTOR DEVICES

(71) Applicant: Infineon Technologies AG, Neubiberg (DE)

(72) Inventors: Ralf Siemieniec, Villach (AT); Thomas Aichinger, Faak am See (AT); Iris Moder, Villach (AT); Francisco Javier Santos Rodriguez, Villach (AT); Hans-Joachim Schulze, Taufkirchen (DE); Carsten von Koblinski, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/693,909

(22) Filed: Nov. 25, 2019

(65) Prior Publication Data
US 2020/0176580 A1 Jun. 4, 2020

(30) Foreign Application Priority Data
Nov. 29, 2018 (DE) .......................... 102018130385.8

(51) Int. Cl.
| | | |
|---|---|---|
| H01L 29/49 | (2006.01) | |
| H01L 29/16 | (2006.01) | |
| H01L 29/40 | (2006.01) | |
| H01L 29/423 | (2006.01) | |
| H01L 29/66 | (2006.01) | |
| H01L 29/78 | (2006.01) | |
| H01L 21/02 | (2006.01) | |
| H01L 21/04 | (2006.01) | |
| H01L 29/45 | (2006.01) | |

(52) U.S. Cl.
CPC .... *H01L 29/4966* (2013.01); *H01L 21/02244* (2013.01); *H01L 21/02258* (2013.01); *H01L 21/049* (2013.01); *H01L 29/1608* (2013.01); *H01L 29/407* (2013.01); *H01L 29/4236* (2013.01); *H01L 29/42376* (2013.01); *H01L 29/45* (2013.01); *H01L 29/66068* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 2012/0217513 A1* | 8/2012 | Tega .................... | H01L 29/7813 257/77 |
| 2014/0145206 A1* | 5/2014 | Siemieniec ........... | H01L 29/401 257/77 |
| 2016/0056251 A1* | 2/2016 | Laven ............... | H01L 27/11521 257/326 |
| 2016/0181408 A1* | 6/2016 | Aichinger ........... | H01L 29/4238 257/77 |

(Continued)

*Primary Examiner* — Khaja Ahmad
(74) *Attorney, Agent, or Firm* — Murphy, Bilak & Homiller, PLLC (57) ABSTRACT

A silicon carbide device includes a silicon carbide substrate having a body region and a source region of a transistor cell. Further, the silicon carbide device includes a titanium carbide gate electrode of the transistor cell.

15 Claims, 8 Drawing Sheets

(56) References Cited

U.S. PATENT DOCUMENTS

| | | | |
|---|---|---|---|
| 2016/0190301 A1* | 6/2016 | Aichinger | H01L 27/0207 |
| | | | 257/77 |
| 2016/0260709 A1* | 9/2016 | Rupp | H01L 27/0664 |
| 2017/0103894 A1* | 4/2017 | Aichinger | H01L 29/8613 |
| 2017/0110573 A1* | 4/2017 | Laforet | H01L 29/1095 |
| 2017/0309713 A1* | 10/2017 | Hirler | H01L 29/0623 |
| 2018/0033876 A1* | 2/2018 | Sugahara | H01L 29/1608 |
| 2018/0358449 A1* | 12/2018 | Zeng | H01L 29/4236 |

\* cited by examiner

FIGURE 10

SILICON CARBIDE DEVICES, SEMICONDUCTOR DEVICES AND METHODS FOR FORMING SILICON CARBIDE DEVICES AND SEMICONDUCTOR DEVICES

TECHNICAL FIELD

Examples of the disclosure relate to silicon carbide devices and semiconductor devices. Further examples relate to methods for forming silicon carbide devices and methods for forming semiconductor devices.

BACKGROUND

The dimensions of trench power MOSFETs (metal-oxide-semiconductor field-effect transistor) may be reduced for improving the electrical performance and decreasing the costs from generation to generation, which may be enabled both through better lithography systems and more powerful tools with an improved process control. The reduction of geometrical dimensions might not come without side effects. By reducing the geometries, the width (and thus the extent of the electrode in lateral direction) may be continuously reduced. For example, polycrystalline silicon (also called polysilicon) is used as an electrode material, which shows a strongly increasing sheet resistance below a certain layer thickness due to the crystalline structure of the material. In a stripe cell, this may apply in particular to the field plate electrode, but also the gate resistance might not be at values of <1 Ohm, which may be desired for some applications. Some concepts may use individual cells instead of stripes, where the field plate electrode may have a columnar shape (so-called needle-shape) and is surrounded by a circumferential gate. While the field plate resistance may be rather uncritical due to its direct connection to the source metal, the gate resistance may provide difficulties as the gate trench is arranged between the columns of the field plate electrode. For devices in voltage classes up to approx. 120V very narrow gate widths may be implemented. In this example, the effective width of the gate electrode may be less than 100 nm, which may lead to high values of the distributed gate resistance.

For improving the electrical performance and decreasing the costs, analogously to the silicon counterparts, silicon carbide (SiC) trench power MOSFETs may be further reduced in their geometrical dimensions. This may be enabled by improved lithography systems and more powerful tools with an improved process control and/or alternative cell structures may be used, which may enable minimizing the structural sizes due to their cell design.

By reducing the geometries of the cell, the width (and thus the extent of the electrode in lateral direction) of the gate electrode may be continuously reduced as well. As mentioned, polysilicon may have a strongly increasing sheet resistance below a certain layer thickness due to the crystalline structure of the material. The resulting gate resistance may cause increasing difficulties. Some cell concepts may have an average gate width of approximately 1 µm and may require the introduction of gate fingers at least in case of large chip areas. Apart from the increase of the gate resistance due to the smaller cross sections, an additional increase due to material characteristics may be considered.

Consequently, it may be desired to reduce the resistance of gate electrodes and/or field electrodes.

SUMMARY

An example relates to a silicon carbide device comprising a silicon carbide substrate comprising a body region and a source region of a transistor cell. Further, the silicon carbide device comprises a titanium carbide gate electrode of the transistor cell.

Some examples relate to a semiconductor device comprising a semiconductor substrate comprising a body region and a source region of a transistor cell. Further, the semiconductor device comprises a titanium carbide field electrode of the transistor cell. The titanium carbide field electrode is connected or connectable to a reference voltage metallization structure so that a reference voltage independent from a gate voltage of the transistor cell is providable to the titanium carbide field electrode.

Examples relate to a method for forming a silicon carbide device. The method comprises forming a body region of a transistor cell in a silicon carbide substrate and forming a source region of the transistor cell in the silicon carbide substrate. Further, the method comprises forming a titanium carbide gate electrode of the transistor cell.

BRIEF DESCRIPTION OF THE FIGURES

Some examples of apparatuses and/or methods will be described in the following by way of example only, and with reference to the accompanying figures, in which

FIG. 10, which includes FIG. 10A and 10B, shows a plan view of a silicon carbide device, according to embodiments.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly nor implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Some concepts may implement finger structures, which provide a low ohmic connection from the respective trench electrodes to the respective potential. In this way, very low resistances may be realized, which may be outweighed by a corresponding increasing loss of active area. This negative influence may be higher, the lower the on-resistance per area (Ron×A) of a technology is and might be undesired for wide bandgap technologies like SiC-MOSFETs.

Another concept may make use of siliciding the electrode surface. In this way, a reduction of the gate resistance may be achieved. However, siliciding the electrode surface may be difficult for SiC-MOSFET gate widths in a range of some 100 nm.

A polysilicon gate may also be replaced by a metal gate, which may cause a strong reduction of the distributed resistance. A metal as a gate electrode is used in the field of logics, but the requirements in the field of logics and power may be significantly different.

According to a concept, tungsten may be used for implementing gate electrodes in the power area, which may require the additional use of a titanium nitride (TiN) barrier to the gate insulation layer (e.g. gate oxide). As the deposition of the TiN barrier may be executed using aggressive chemistry (e.g. chlorine), the used oxide may need to be of very good quality. Otherwise, damages to the oxide may occur, which may reduce the lifetime and negatively influence the breakthrough field strength, which in case of SiC-MOSFETs may require a stronger shielding of a gate insulation layer and thus a decreased overall performance. For example, if an oxide is used as a gate insulation layer, the use of grown oxides in a dry atmosphere at high temperatures or alternatively the use of deposited oxides, which are densified at very high temperatures and/or post oxidized, may be necessary. For example, densifying may be done at 1150° C. and post oxidation at 1100° C. to improve the quality of the gate insulation layer.

This may cause problems, when used in SiC-MOSFET. Densifying the deposited tetraethylorthosilicate oxide, for the saturation of interface states, may take place at high temperatures in a range between 1100° C.-1250° C. in a nitrogen monoxide (NO) atmosphere. The anneal may cause a densification of the deposited tetraethylorthosilicate beside the saturation of interface states (by NO). The densification may improve the intrinsic properties of the oxide and may enable less defects in the oxide. The densification may be used for silicon devices as well. The exact process parameters may be selected for good interface characteristics and may be insufficient as a barrier for a tungsten gate for subsequent process steps in an aggressive atmosphere like in a TiN deposition. Subsequent densifying at the indicated high temperatures may already lead to an interface depassivation, and thus may result in a deterioration of the component characteristics. Densifying in oxygen at temperatures above 800° C. may lead to an interface depassivation. A 100% inertial anneal (e.g. in N2) after interface passivation may lead to a shift regarding the threshold voltage, but might not substantially influence the interface characteristics at least with short annealing times and temperatures ≤1000° C.

The high temperature budget may cause difficulties for highly phosphorous-doped substrates (e.g. low-voltage MOSFET for operating voltages <=40V) as well as this may lead to a pronounced diffusion tail for silicon devices. This may again result in a deteriorated Ron×A and consequently all in all to a deteriorated figure of merit FOMs.

It may be desired to provide a concept for a low resistance of gate electrodes for SiC devices and/or field electrodes for semiconductor devices.

Figure 1:
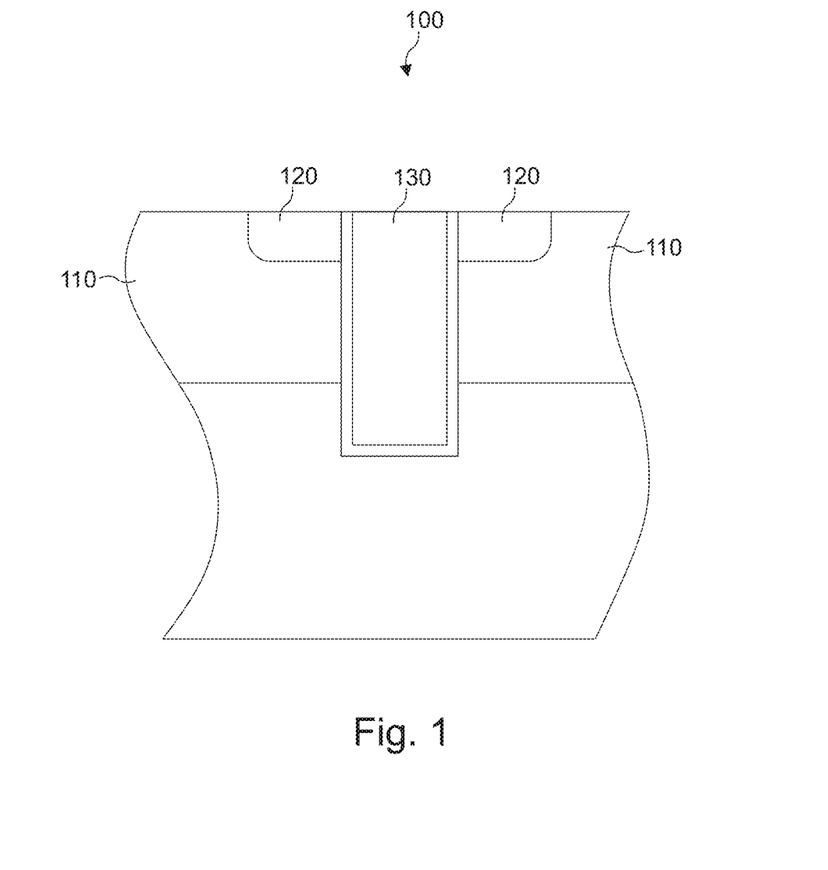
FIG. 1 shows a schematic cross section of a part of a silicon carbide device.

FIG. 1 shows a schematic cross section of a part of a silicon carbide device according to an embodiment. The silicon carbide device 100 may comprise a silicon carbide (SiC) substrate comprising a body region 110 and a source region 120 of a transistor cell. Further, the silicon carbide device 100 may comprise a titanium carbide (TiC) gate electrode 130 of the transistor cell.

By using titanium carbide as material for the gate electrode, the electrical resistance of the gate electrode may be significantly reduced in comparison to a polysilicon gate electrode. In this way, the implementation of gate fingers to contact the gates more often might not be necessary, which may reduce the required die area. Further, the homogeneity of the switching of transistor cells may be improved and/or switching losses may be reduced, for example, for devices with high switching frequencies. Furthermore, the use of titanium carbide can be advantageous for processing the wafers due to its high melting temperature.

The source region 120 may be a doping region having a first conductivity type and the body region 110 may be a doping region having a second conductivity type. The body region 110 may be located adjacent to the source region 120 so that a pn-junction arises between the body region 110 and the source region 120. A doping region of the first conductivity type may be a p-doped region (e.g. caused by incorporating aluminum ions or boron ions) or an n-doped region (e.g. caused by incorporating nitrogen ions or phosphor ions). Consequently, the second conductivity type indicates an opposite n-doping or p-doping. In other words, the first conductivity type may indicate an n-doping and the second conductivity type may indicate a p-doping or vice-versa.

For example, the TiC gate electrode 130 or at least a TiC layer of the TiC gate electrode 130 comprises TiC as main material. The TiC gate electrode 130 or at least a TiC layer of the TiC gate electrode 130 may comprise at least 90% (or at least 95% or at least 99%) TiC. For example, the TiC gate electrode 130 or at least a TiC layer of the TiC gate electrode 130 may comprise solely TiC except for impurities and/or contaminations having no or only neglectable influence on the electrical functionality. For example, the TiC gate electrode 130 may comprise at least a TiC layer having a thickness of at least 50 nm (or at least 100 nm or at least 200 nm). The TiC gate electrode 130 or at least a TiC layer of the TiC gate electrode 130 may be located adjacent to and/or directly adjoining a gate insulation layer of the transistor cell. The gate insulation layer of the transistor cell may be an oxide layer (e.g. SiO2 layer) located between the body region 120 and the TiC gate electrode 130. In some embodiments, the gate insulation layer may comprise a so-called high-K dielectric.

The TiC gate electrode 130 may be connected to a gate contact structure, a gate metallization structure, a gate wiring structure and/or a gate pad. A gate voltage may be applied to the TiC gate electrode 130 during operation of the silicon carbide device 100 to control a current flow through a channel region of the body region 120.

The TiC gate electrode 130 may be a planar gate electrode. A planar electrode may, for example, be positioned on a front side surface of the silicon carbide substrate. Alternatively, the TiC gate electrode 130 may be located in a gate trench. The TiC gate electrode 130 may then be part of a so-called trench gate.

For example, the transistor cell comprises a trench gate comprising the gate trench and the TiC gate electrode 130 located in the gate trench. The gate trench may extend from a surface (e.g. the front side surface) of the silicon carbide substrate into the silicon carbide substrate. A width of the gate trench measured at the surface of the silicon carbide substrate may be at most 1.5 μm (or at most 1.2 μm or at most 0.8 μm or at most 0.5 μm). The width of the gate trench may be constant or may vary along the gate trench. If the width varies along the gate trench, a width of the gate trench may be at most 1.5 μm (or at most 1.2 μm or at most 0.8 μm or at most 0.5 m) at the narrowest part of the gate trench. The gate trench may extend deeper into the silicon carbide substrate than the body region 120. The gate trench may be completely filled with TiC material except for a gate insulation layer of the trench gate. The gate insulation layer may line the gate trench. Alternatively, one or more voids may exist in the center or in proximity to the center of the gate trench. Alternatively, a TiC layer of the TiC gate electrode 130 may be located adjacent to the gate insulation layer and a core region of the gate trench may be filled with another material (e.g. polysilicon).

For example, the silicon carbide device 100 may comprise a plurality of gate trenches or a grid of gate trenches. The gate trenches of the plurality of gate trenches may be stripe-shaped gate trenches. A titanium carbide gate electrode may be located in each gate trench of the plurality of gate trenches. The silicon carbide device 100 may comprise further trenches (e.g. edge trenches) in addition to the plurality of gate trenches.

Figures 10, 10A:
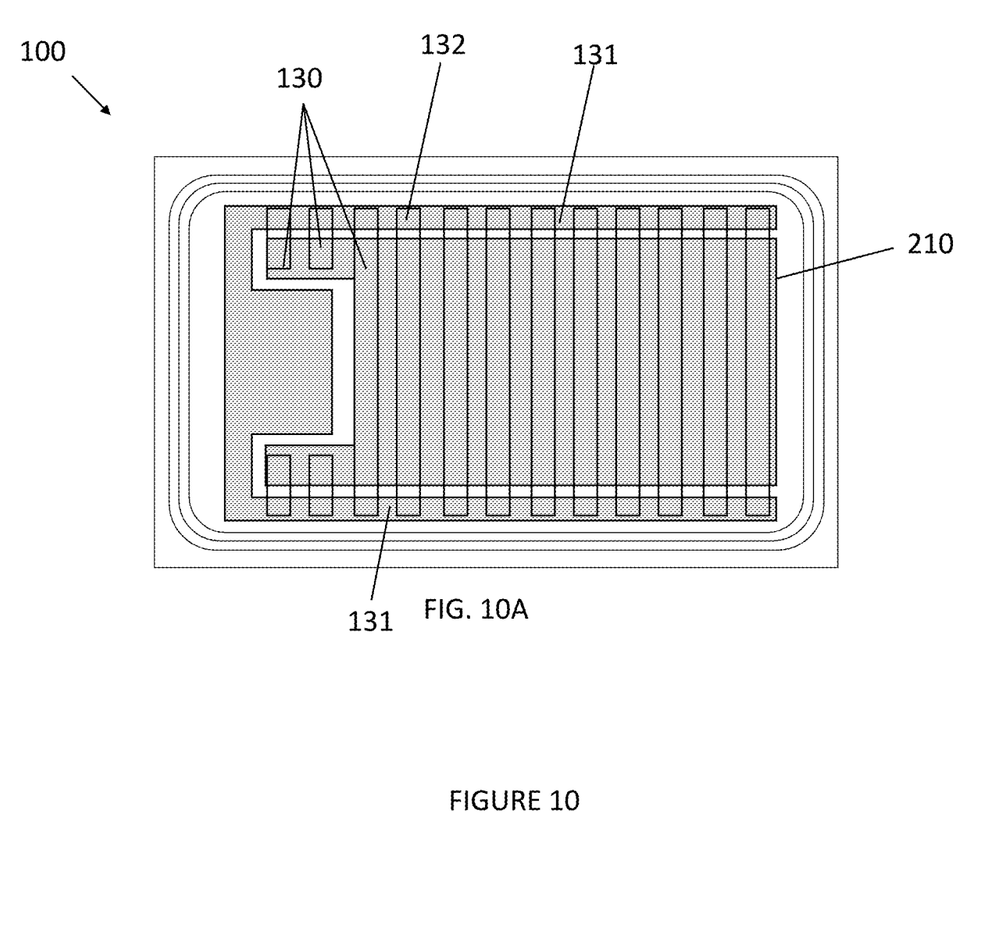
Figures 10, 10B:
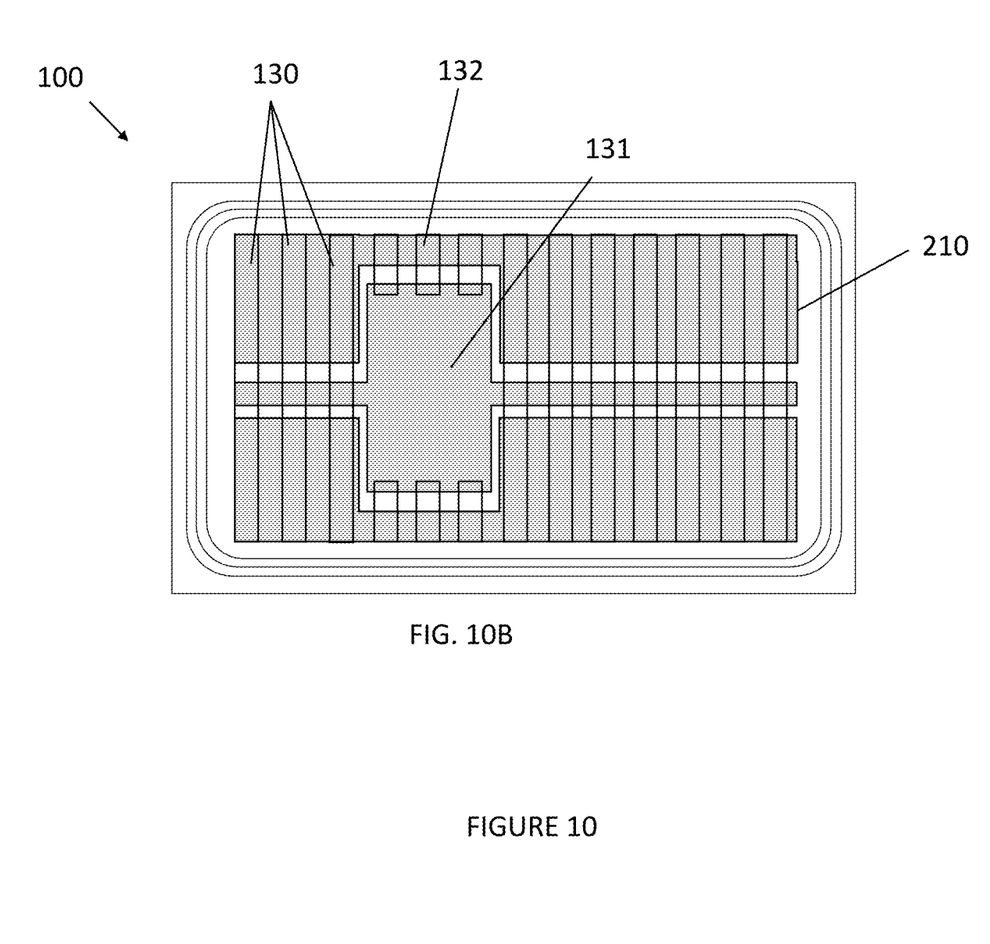

The titanium carbide gate electrodes may be connected to a gate contact structure 131 (e.g. a gate runner or gate ring) at an edge of a cell field of the silicon carbide device 100 and/or an edge of an active area of the silicon carbide substrate. For example, the titanium carbide gate electrodes may be connected to a gate metallization structure 131 solely at end regions 132 of the titanium carbide gate electrodes as shown in FIGS. 10A and 10B. The end regions 132 of the titanium carbide gate electrodes may extend from the respective lateral ends of the titanium carbide gate electrodes over at most 10% of a length of the respective titanium carbide gate electrode as shown in FIGS. 10A and 10B. Due to the low electrical resistance of the TiC gate electrodes, it may be sufficient to contact the TiC gate electrodes at the ends only. The implementation of gate finger may be avoided.

Figure 3:
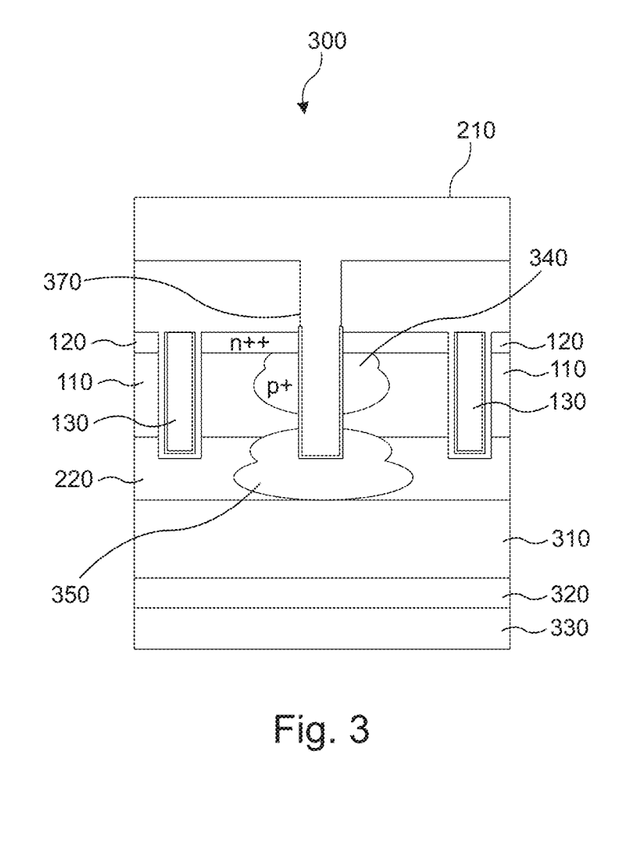
FIG. 3 shows a schematic cross section of a part of a silicon carbide device comprising a buried p-doped region connected to the source metallization.
Figure 4:
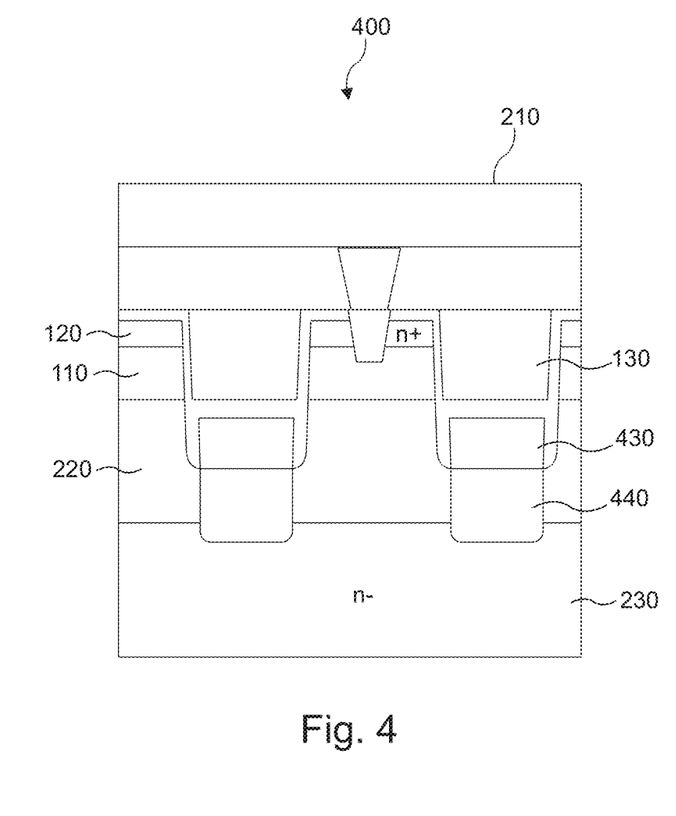
FIG. 4 shows a schematic cross section of a part of a silicon carbide device comprising additional titanium carbide electrodes within the gate trenches.

Additionally, the silicon carbide device 100 may comprise a titanium carbide contact electrode located in the gate trench (e.g. as shown in FIG. 4) or in a contact trench (e.g. as shown in FIG. 3). The TiC contact electrode may be electrically connected to the source region 120 of the transistor cell. If the TiC contact electrode is located in the gate trench, the TiC contact electrode may be located deeper within the gate trench than the TiC gate electrode 130 at least in places. For example, the TiC contact electrode may be located below the TiC gate electrode 130 at least in places. A reference voltage (e.g. source voltage) may be applied to the TiC contact electrode during operation of the silicon carbide device 100. The TiC contact electrode may influence the electric field in proximity of the bottom of the gate trench and/or may contact a buried doping region (e.g. as for the deep p-junction field effect transistor as shown in FIG. 4) at the bottom of the gate trench. The contact trench may be different to the gate trench and/or may be separate from the gate trench. The contact trench may be free of a gate electrode and/or of a material directly electrically connected to the gate electrode. For example, the contact trench may be a source contact trench (e.g. as shown in FIG. 3).

Figure 2:
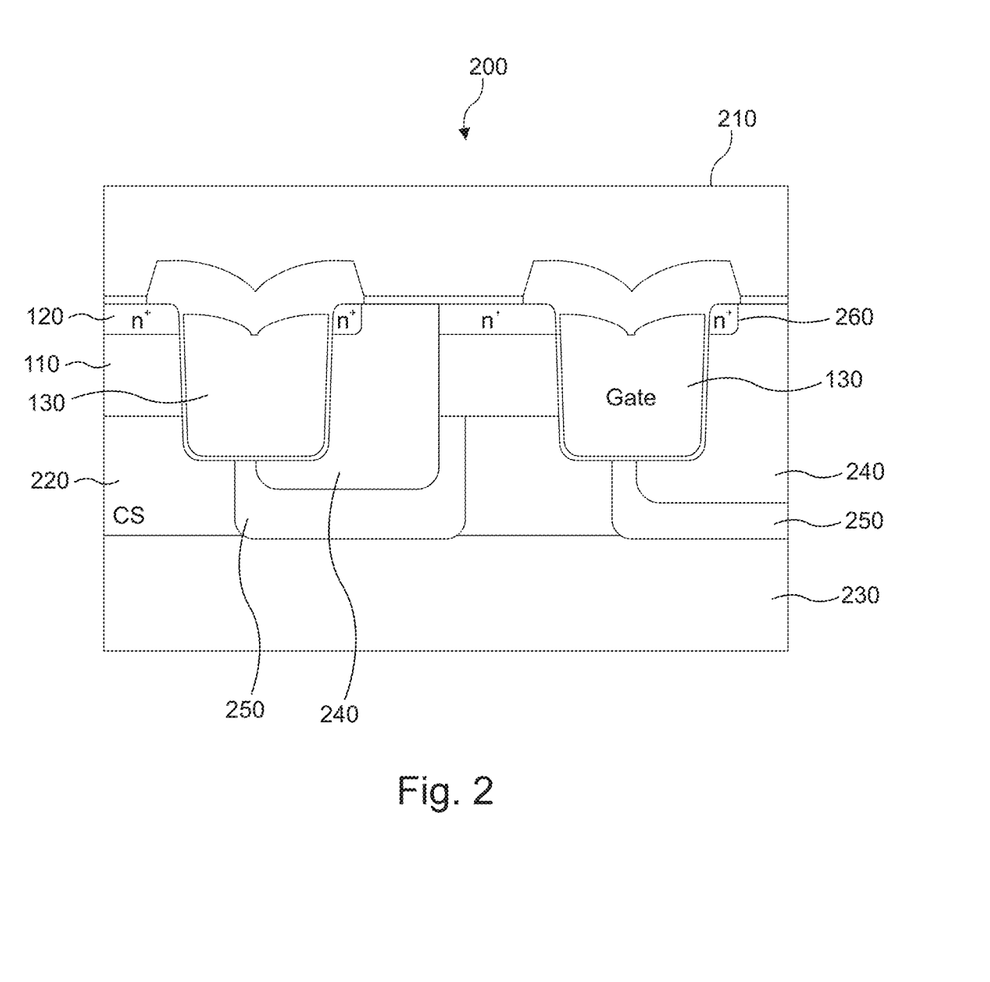
FIG. 2 shows a schematic cross section of a part of a silicon carbide device having a channel at one side of each gate trench.

For example, a transistor (e.g. transistor cell) may be arranged at only one side of the trench gate (e.g. as shown in FIG. 2). In this case, a first sidewall of the gate trench may adjoin the transistor cell. A second, opposite sidewall may be free of a transistor cell. Alternatively, the transistor cell of the silicon carbide device 100 may be located on two sides of the gate trench so that a body region may be located at two opposite sides of the gate trench (e.g. as shown in FIG. 1, 3 or 4). For example, at least one portion of each body region may be in contact with a respective sidewall of a gate trench, e.g. a gate insulation layer of the gate trench.

For example, the transistor cell is a vertical transistor cell configured to conduct current between a front side of the silicon carbide substrate and a backside of the silicon carbide substrate. The source region 120, the body region 110, and a drift region of the transistor cell may be arranged vertically within the silicon carbide substrate. The source region 120 may be located at a front side surface of the silicon carbide substrate.

For example, a vertical direction and a vertical dimension or thicknesses of layers may be measured orthogonal to a front side surface and/or a back side surface of the silicon carbide substrate and a lateral direction and lateral dimensions may be measured in parallel to the front side surface and/or a back side surface of the silicon carbide substrate.

The front side of the SiC substrate may be the side used to implement more sophisticated and complex structures (e.g. gates of transistors, wiring structures and/or contact pads) than at the back side of the SiC substrate, since the process parameters (e.g. temperature) and the handling may be limited for the back side, if structures are already formed at the front side of the SiC substrate, for example.

The silicon carbide device 100 may further comprise a drain region of the transistor cell (e.g. for a MOSFET) having the first conductivity type or a collector region of the transistor cell (e.g. for an insulated gate bipolar transistor IGBT) having the second conductivity type. The drain region or the collector region may have an average net doping concentration. The average net doping concentration of the drain region or the collector region may be at least 30 times or even at least 100 times the average net doping concentration of the drift region, for example. The drain region or the collector region may be located at a back side of the silicon carbide substrate.

The transistor cell of the silicon carbide device 100 may be a transistor cell of a plurality of transistor cells of a transistor arrangement. Each transistor cell may comprise one or more source regions (e.g. distributed or located along a gate), at least one body region and a gate electrode (e.g. a trench gate electrode located within a gate trench extending into the SiC substrate), for example. Further, the transistor cells of the plurality of transistor cells may share a common (mutual) drift region and/or a common drain region (e.g. if the transistor cells are MOSFET cells) or a common collector region (e.g. if the transistor cells are IGBT cells). For example, the transistor arrangement of the silicon carbide device 100 comprises a plurality of source doping regions connected to a source wiring structure, a plurality of TiC gate electrodes or a TiC gate electrode grid connected to a gate wiring structure and a back side drain or collector metallization.

The silicon carbide device 100 may be a power semiconductor device. A power semiconductor device or an electrical structure (e.g. the transistor cell of the silicon carbide device 100) of the power semiconductor device may have a breakdown voltage or blocking voltage of more than 300 V or more than 1000 V or more than 2 kV.

The proposed concept may use TiC as a gate material for SiC power transistors. TiC may be a very temperature-stable material having low sheet resistance. The use of titanium carbide as a temperature-stable and highly conductive electrode material for the gate in SiC MOSFETs may be proposed for realizing a low distributed resistance instead of implementing polysilicon and/or the active area consuming gate finger structures. Additionally, TiC may be used as material for a contact electrode or a source electrode (e.g. for contacting buried regions, as, e.g., shown in FIG. 4).

For example, the titanium carbide is formed by a thermal process at temperatures of at most 1000° C. after the deposition of carbon and titanium after a preceding patterning (e.g. explained in more detail in connection with FIG. 8). Due to a consequent reduction of the required temperature budget, a depassivation of the oxide interface states (of the gate insulation layer) may be avoided as far as possible, for example.

The proposed concept may enable lower manufacturing costs at an improved performance (e.g. preventing inactive areas without controlled current flow for finger structures with at the same time lower distributed resistances) and/or a pitch reduction by smaller gate trench geometries.

Some embodiments relate to semiconductor devices with a transistor comprising a TiC gate electrode as described with respect to FIG. 1. In these examples, the used semiconductor substrate may be another wide band gap semiconductor substrate or a silicon substrate instead of silicon carbide. For example, a wide band gap semiconductor substrate may have a band gap larger than 2 eV or larger than 3 eV. For example, the wide band gap semiconductor substrate may be a silicon carbide substrate, a diamond (C) substrate, a gallium oxide ($Ga_2O_3$), gallium arsenide (GaAs) or a gallium nitride (GaN) substrate.

The semiconductor substrate may be a semiconductor bulk substrate (e.g. obtained from a semiconductor boule) or an epitaxially grown semiconductor substrate or may comprise an epitaxial semiconductor layer (e.g. for implementing the source region, the body region and/or the drift region of a vertical transistor cell) grown on a semiconductor bulk substrate (e.g. for implementing a drain region or a collector region of a transistor cell).

FIG. 2 shows a schematic cross section of a part of a silicon carbide device having a channel at one side of each gate trench according to an embodiment. The silicon carbide device 200 may be implemented similar to the silicon carbide device described in connection with FIG. 1. The silicon carbide device 200 comprises a transistor cell comprising a body region 110 located vertically between a highly n-doped source region 120 and a lightly n-doped drift region 230. Further, an n-doped current spread region 220 may be optionally located between the body region 110 and the drift region 230.

The silicon carbide device 200 comprises a TiC gate electrode 130 in a gate trench. For example, a gate insulation layer of the trench gate is located between the body region and the TiC gate electrode 130. In an operating mode of the transistor, a current flow through a channel region of the transistor may be controlled by a gate voltage applied to the TiC gate electrode 130.

A highly p-doped region 240 of the silicon carbide device 200 may be located adjacent to the gate insulation layer at a second side wall of the gate structure opposite to a first side wall of the gate trench located adjacent to the body region of the transistor. The highly p-doped region 240 extends from the bottom of the gate trench along the second side wall of the trench gate to a highly n-doped region 260 and/or to the front side surface. Further, a highly p-doped shielding region 250 may be located at the bottom of the trench gate. The highly p-doped shielding region 250 may be in contact with or part of the highly p-doped region 240.

The highly n-doped region 260 may extend along the second side wall of the trench gate from the highly p-doped region 240 to the front side surface of the silicon carbide substrate. The highly n-doped region 260 may be formed simultaneously with the source region 120. For example, the highly n-doped region 260 may be electrically connected to the source region 120.

Further, a source metallization 210 is located on the silicon carbide substrate. The source metallization 210 is electrically connected to the source region 120. Further, the source metallization 210 may be connected to the body region 110, e.g. via the highly p-doped region 240.

FIG. 2 shows an asymmetric MOSFET cell concept. Although the average gate width (e.g. width of the gate electrode averaged along the gate trench) may be less than 1.5 µm (or less than 1.2 µm or less than 0.8 µm), the introduction of gate fingers for large chip areas might not be necessary due to the implementation of a TiC gate electrode.

More details and aspects are mentioned in connection with the embodiments described above or below. The silicon carbide device shown in FIG. 2 may comprise one or more optional additional features corresponding to one or more aspects mentioned in connection with the proposed concept of one or more embodiments described above or below (e.g. FIGS. 1 and/or 3-9).

FIG. 3 shows a schematic cross section of a part of a silicon carbide device 300 comprising a buried p-doped region 350 connected to the source metallization according to an embodiment. Some aspects of the silicon carbide device 300 may be implemented similar or identical to the silicon carbide device described in connection with FIG. 1 and/or FIG. 2. However, a source contact trench is located between two gate trenches. The source contact trench may extend deeper into the silicon carbide substrate than the body region 110 or they may extend to an equal depth. A buried p-doped region 350 is located at the bottom of the source contact trench. For example, the buried p-doped region 350 may be contacted by the source contact trench. Further, a highly p-doped body contact region 340 is located adjacent to the source contact trench and vertically between the source region 120 and the buried p-doped region 350. A source contact electrode 370 is located in the source contact trench to obtain an ohmic contact to the source region 120 and the body region 110. The source contact electrode 370 may be a TiC source contact electrode connected to the source metallization 210 (e.g. power metallization).

The drift region 310 is implemented by a lightly n-doped epitaxial layer. Additionally, an n-doped buffer layer 320 is implemented between the drain region 330 (e.g. highly n-doped substrate layer) and the drift region 310. Further, an inter-layer dielectric may be located vertically between the source metallization 210 and the silicon carbide substrate.

For example, the cell concept shown in FIG. 3 may use structure widths (e.g. width of the gate electrode) as small as possible, for example, in a range ≤350 nm (or less than 500 nm or less than 250 nm) for achieving a good performance. Due to the usage of TiC for the gate electrode, an increase of the gate resistance due to the smaller cross section and/or an additional increase due to material characteristics may be avoided.

More details and aspects are mentioned in connection with the embodiments described above or below. The silicon carbide device shown in FIG. 3 may comprise one or more optional additional features corresponding to one or more aspects mentioned in connection with the proposed concept of one or more embodiments described above or below (e.g. FIGS. 1-2 and/or 4-9).

FIG. 4 shows a schematic cross section of a part of a silicon carbide device 400 comprising contact electrodes within the gate trenches according to an embodiment. The silicon carbide device 400 may be implemented similar to the silicon carbide device described in connection with FIGS. 1, 2 and/or 3.

In addition to the TiC gate electrode 130, an additional TiC electrode 430 may be located at a bottom of the gate trench. The additional TiC electrode 430 may be used to contact a buried shielding region 440 (e.g. deep p-junction field effect transistor JFET region) located adjacent to and/or below a bottom of the gate trench. The additional TiC electrode 430 may be connected or connectable to a different voltage (e.g. source voltage) than the gate electrode (e.g. the gate voltage).

FIG. 4 may show a cell concept with a buried electrode (additional TiC electrode 430) for contacting the buried shielding region 440. Using polysilicon may result in the necessity of finger structures, in particular for connecting the buried regions 440, which may lead to a substantial loss of active area. This may be avoided by the implementation of the additional electrode 430.

More details and aspects are mentioned in connection with the embodiments described above or below. The silicon carbide device shown in FIG. 4 may comprise one or more optional additional features corresponding to one or more aspects mentioned in connection with the proposed concept of one or more embodiments described above or below (e.g. FIGS. 1-3 and/or 5-9).

Figure 5:
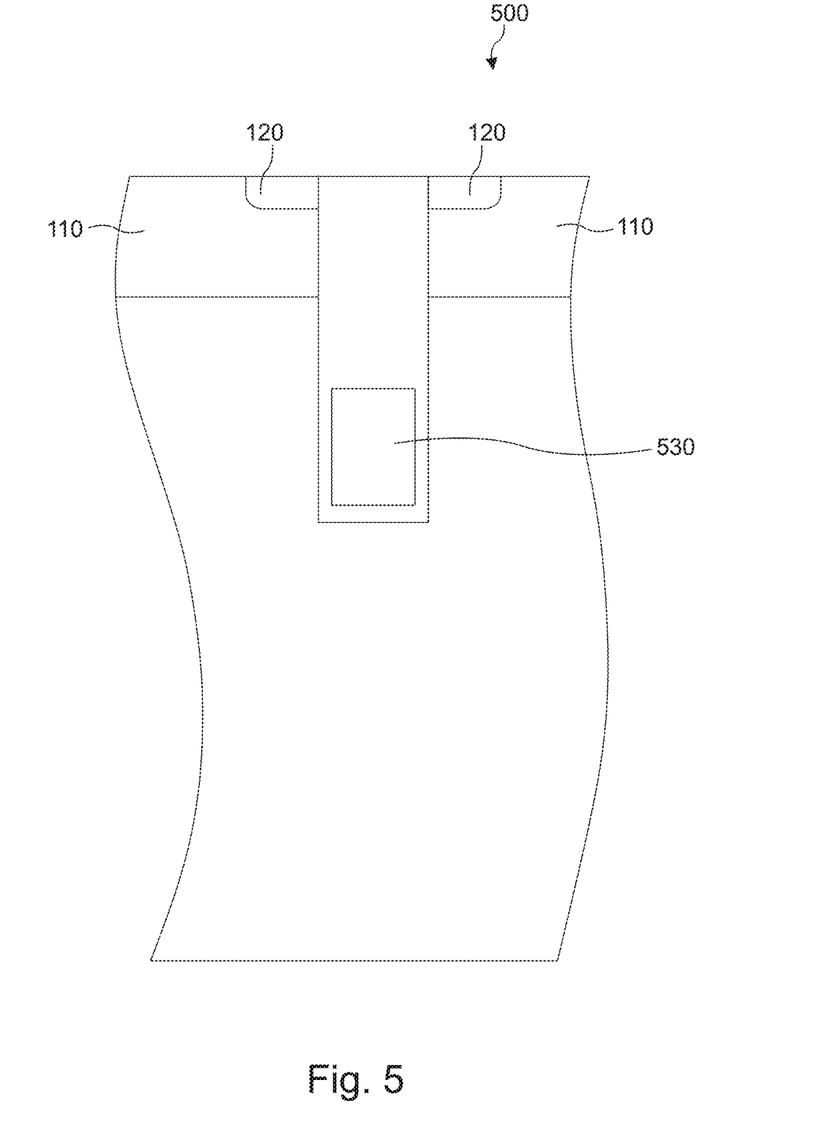
FIG. 5 shows a schematic cross section of a part of a semiconductor device.

FIG. 5 shows a schematic cross section of a part of a semiconductor device according to an embodiment. The semiconductor device 500 may comprise a semiconductor substrate comprising a body region 110 and a source region 120 of a transistor cell. Further, the semiconductor device 500 may comprise a titanium carbide field electrode 530 of the transistor cell. The titanium carbide field electrode 530 may be connected or connectable to a reference voltage metallization structure so that a reference voltage (e.g. source voltage) independent from a gate voltage of the transistor cell is providable to the titanium carbide field electrode 530.

By using titanium carbide as material for the field electrode, the resistance of the field electrode may be significantly reduced in comparison to a polysilicon field electrode. In this way, the implementation of contact finger structures to contact the field electrodes at several contact points might not be necessary, which may reduce the required die area.

By implementing a field electrode (e.g. field plate or a columnar field electrode), a lower on-resistance may be achieved, while providing the same breakdown voltage. For example, a field plate trench structure may utilize lateral charge compensation, altering the electrical field profile for higher breakdown, which may enable an increased doping concentration in the drift region. In this way, the on-resistance may be significantly reduced.

The titanium carbide field electrode 530 may be connected or connectible (e.g. through a control transistor) to a reference voltage metallization structure (e.g. a reference voltage wiring structure and/or a reference voltage pad), for example, the source metallization structure, the source wiring structure and/or the source pad. During operation, the reference voltage (e.g. source voltage and/or ground voltage) may be provided to the titanium carbide field electrode 530 through the reference voltage metallization structure.

The titanium carbide field electrode 530 may be located in a trench (e.g. a field electrode trench and/or a gate trench). The trench may extend from a surface of the semiconductor substrate into the semiconductor substrate.

For example, the TiC field electrode 530 or at least a TiC layer of the TiC field electrode 530 comprises TiC as a main material. The TiC field electrode 530 or at least a TiC layer of the TiC field electrode 530 may comprise at least 90% (or at least 95% or at least 99%) TiC. For example, the TiC field electrode 530 or at least a TiC layer of the TiC field electrode 530 may comprise solely TiC except for impurities and/or contaminations having no or only neglectable influence on the electrical functionality. For example, the TiC field electrode 530 may comprise at least a TiC layer having a thickness of at least 50 nm (or at least 100 nm or at least 200 nm). The TiC field electrode 530 or at least a TiC layer of the TiC field electrode 530 may be located directly adjacent to a field electrode insulation layer of the transistor cell. The field electrode insulation layer of the transistor cell may be an oxide layer (e.g. SiO2 layer) located between the semiconductor substrate and the TiC field electrode 530. A thickness of the field electrode insulation layer may be larger than a thickness of a gate insulation layer of the transistor cell.

The semiconductor device 500 may comprise a gate electrode (e.g. a TiC gate electrode) in addition to the TiC field electrode 530. The gate electrode may be located in the same trench as the field electrode 530 (e.g. shown in FIG. 6) or in a separate gate trench (e.g. shown in FIG. 7). If the gate electrode and the TiC field electrode 530 are located in the same trench, the TiC field electrode 530 may be located deeper in the trench than the gate electrode at least in places.

The use of titanium carbide as a temperature-stable and highly conductive electrode material for the field plate and/or if applicable the gate of a field plate trench MOSFETs may be proposed for realizing a low distributed resistance instead of the often used polysilicon and in order to eliminate active area consuming finger structures.

For example, the titanium carbide may be formed after the deposition of carbon and titanium after a preceding patterning by a thermal process (e.g. explained in more detail in connection with FIG. 9).

Lower manufacturing costs at an improved performance may be enabled (e.g. preventing dead areas for finger structures with at the same time lower distributed resistances).

The semiconductor substrate may be a silicon substrate.

The semiconductor device 500 may be a power semiconductor device. A power semiconductor device or an electrical structure (e.g. the transistor cell of the semiconductor device 500) of the power semiconductor device may have a breakdown voltage or blocking voltage of more than 10 V or more than 100 V or more than 300 V.

More details and aspects are mentioned in connection with the embodiments described above or below. The semiconductor device shown in FIG. 5 may comprise one or more optional additional features corresponding to one or more aspects mentioned in connection with the proposed concept of one or more embodiments described above or below (e.g. FIGS. 1-4 and/or 6-9).

Figure 6:
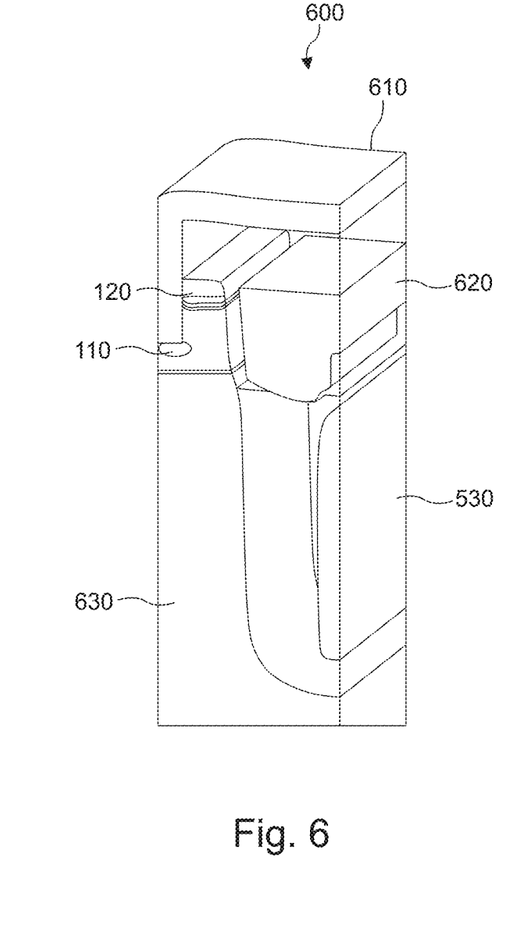
FIG. 6 shows a schematic cross section of a part of a semiconductor device comprising a field electrode within the gate trench.

FIG. 6 shows a schematic cross section of a part of a semiconductor device 600 comprising a field electrode within the gate trench according to an embodiment. The semiconductor device 600 may be implemented similar to the semiconductor device described in connection with FIG. 5.

The semiconductor device 600 comprises a plurality of stripe-shaped gate trenches of transistor cells. A TiC field electrode 530 and a gate electrode 620 (e.g. TiC gate electrode) may be located in each gate trench. A source metallization structure 310 may be connected to the body region 110 and the source region 120. For example, the body region 110 is located vertically between the source region 120 and a drift region 630 of the transistor cell.

A length of a stripe-shaped gate trench may be at least 10 times (or at least 100 times) a width of the stripe-shaped gate trench.

More details and aspects are mentioned in connection with the embodiments described above or below. The semiconductor device shown in FIG. 6 may comprise one or more optional additional features corresponding to one or more aspects mentioned in connection with the proposed concept of one or more embodiments described above or below (e.g. FIGS. 1-5 and/or 7-9).

Figure 7:
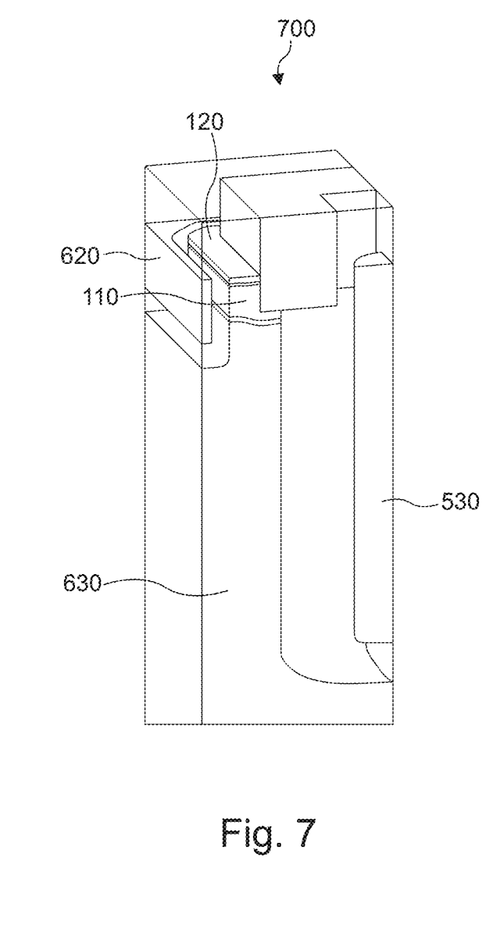
FIG. 7 shows a schematic cross section of a part of a semiconductor device comprising a field electrode within a field electrode trench.

FIG. 7 shows a schematic cross section of a part of semiconductor device 700 comprising a field electrode within a field electrode trench according to an embodiment. The semiconductor device 700 may be implemented similar to the semiconductor device described in connection with FIG. 5.

The semiconductor device 700 may comprise a plurality of columnar field electrode trenches (also called "needle trenches") surrounded by gate trenches of transistor cells. For example, the TiC field electrode 530 and the gate electrode 630 (e.g. TiC gate electrode) are located in separate trenches.

A maximum depth of a columnar field electrode trench may be at least 5 times (or at least 10 times) a maximum lateral dimension of the columnar field electrode trench. A maximum depth of the columnar field electrode trench may be at least 2 times (or at least 5 times) a maximum depth of the gate trench.

More details and aspects are mentioned in connection with the embodiments described above or below. The semiconductor device shown in FIG. 7 may comprise one or more optional additional features corresponding to one or more aspects mentioned in connection with the proposed concept of one or more embodiments described above or below (e.g. FIGS. 1-6 and/or 8-9).

Figure 8:
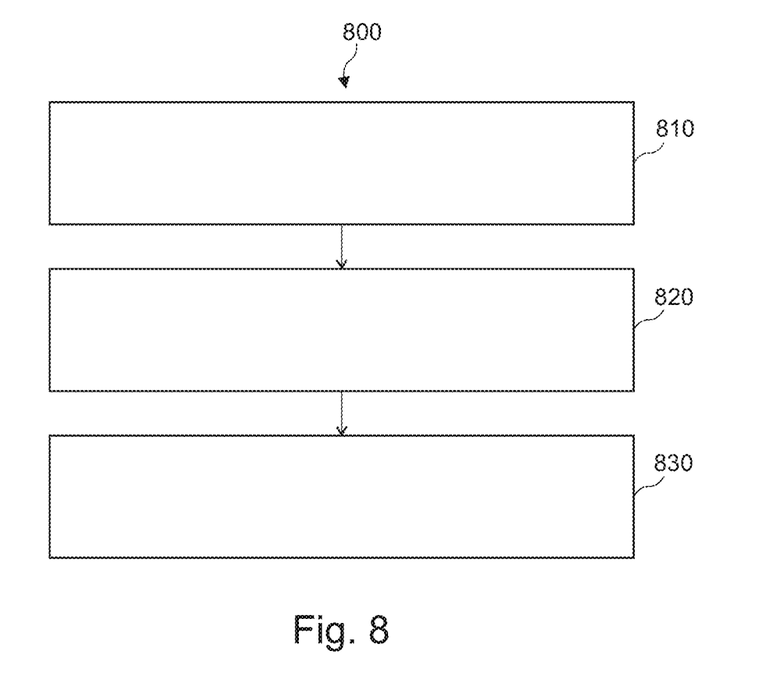
FIG. 8 shows a flow chart of a method for forming a silicon carbide device.

FIG. 8 shows a flow chart of a method for forming a silicon carbide device according to an embodiment. The method 800 may comprise forming 810 a body region of a transistor cell in a silicon carbide substrate and forming 820 a source region of the transistor cell in the silicon carbide substrate. Further, the method 800 may comprise forming 830 a titanium carbide gate electrode of the transistor cell.

The body region and the source region of the transistor cell may be formed by implanting dopants and/or by growth (e.g. epitaxial growth) of doped silicon carbide material. The body region and/or the source region of the transistor cell may be formed before the titanium carbide gate electrode.

The titanium carbide gate electrode may be a trench gate electrode located in a gate trench or a lateral gate electrode located on a surface of the silicon carbide substrate. For example, the method 800 may additionally comprise forming a gate trench extending from a surface of the silicon carbide substrate into the silicon carbide substrate.

To generate a highly conductive gate electrode, the use of titanium carbide may be proposed. For example, titanium carbide has a very good electrical conductivity (e.g. metallic performance and substantially improved electrical conductivity as compared to doped polysilicon) and has a melting point of 3140° C., but it is stable under the influence of air (e.g. oxygen rich atmosphere) only up to 800° C.

Due to the high melting point, the subsequent processing might not be subject to any limitations, if the TiC material is encapsulated. This might be ensured, if the inter layer dielectric ILD deposition directly follows the gate deposition and patterning, for example. For example, for SiC devices all or most doping regions may be already generated before the gate insulation layer, since the required high activation temperatures of often >1600° C. may otherwise lead to a damage of the gate insulation layer and/or the interface passivation. For example, substantially no high-temperature process may be necessary after the TiC deposition (e.g. a phosphosilicate glass PSG annealing in N2 at 800° C. and/or contact annealing by rapid thermal processing RTP at 1000° C. may be the highest temperatures). Further, in comparison to the deposition of TiN, a chlorine precursor might not be necessary for forming the TiC. Consequently, it may be possible to avoid damages caused by the usage of chlorine.

In comparison to the metal system of TiN and W, the overall process temperature may be lower for forming the complete trench gate. Titanium carbide may be deposited by physical vapor deposition PVD (e.g. titanium and methane) and/or chemical vapor deposition CVD (e.g. titanium tetrachloride and methane). Alternatively, TiC may be formed by a direct synthesis of the two elements by depositing both a carbon layer (e.g. graphite) and a titanium layer and subsequently generating titanium carbide under the influence of a high temperature (e.g. from approx. 900° C. to 1000° C.). The required temperature budget may be comparatively low and thus may minimize negative influences on the gate insulation layer already passivated before. In order to avoid a possible damage of the oxide by the titanium deposition, the carbon layer may be deposited before the titanium layer. Possible titanium residues after the formation of titanium carbide may be chemically removed. For example, chemical removal may be performed with an etchant that does not attack titanium carbide as compared to titanium. One example of such an etchant is sulfuric acid.

As mentioned, the manufacturing of titanium carbide may be done in various possible ways. For example, TiC may be deposited (e.g. by PVD or CVD) on a gate insulation layer located on the silicon carbide substrate. Alternatively, the forming 830 of the titanium carbide gate electrode may comprise forming a carbon layer, forming a titanium layer and/or a titanium oxide layer on the carbon layer and annealing, after forming the titanium layer, to obtain the titanium carbide gate electrode. The annealing may be performed at a temperature of at most 1100° C. (or at most 1050° C. or at most 1000° C.) and/or of at least 800° C. (or at least 900° C. or at least 950° C.). Additionally, the forming 830 of the titanium carbide gate electrode may comprise oxidizing (e.g. by an anodic oxidation) the titanium layer before the annealing.

For example, titanium may be deposited onto an existing carbon layer (e.g. previously formed on the gate insulation layer). To generate thicker titanium carbide layers and simultaneously keep the time in the temperature process low, titanium and carbon may be deposited alternatingly. In other words, the forming of a carbon layer and the forming at least one of a titanium layer and a titanium oxide layer may be repeated alternatingly to form a layer stack of alternating carbon and at least one of titanium layers and titanium oxide layers.

The stoichiometry (e.g. Ti:C~1:1) may be considered for forming the TiC. For example, if the TiC material arises from a titanium layer and a carbon layer, achieving a stoichiometric ratio of Ti:C~1:1 may require that a layer thickness of the titanium layer is approximately twice the layer thickness of the carbon layer (i.e., the ratio of the layer thicknesses is Ti:C~2:1). This may be due to the fact that the density of titanium is approximately twice the density of carbon. In the subsequent furnace process (e.g. in an inert atmosphere at a temperature of 900° C.-1200° C.) titanium carbide may be formed. Excess titanium may be chemically removed for example using sulfuric acid.

Alternatively to the reaction of the pure elements, titanium carbide may also be formed from the reaction of titanium dioxide and carbon as pure titanium might not be formed.

Titanium dioxide may, for example, be deposited by means of atomic layer deposition ALD, CVD, PVD or Spin On.

For example, a trench device (e.g. device with TiC gate electrode in a gate trench) may be formed by at least the following process steps in the order as follows (e.g. any additional intermediate steps may be possible):
  Providing a SiC substrate comprising a doped epitaxial layer (so-called buffer layer) and a more lightly doped epitaxial layer
  Forming of doping regions (e.g. body and source regions)
  Etching of the gate trench, post processing of the gate trench sidewall and rounding of the gate trench bottom
  Optionally, forming of sacrificial oxide
  Forming of the gate insulation layer
  Post annealing of the gate insulation layer
  Forming of the TiC gate electrode
  Encapsulating the TiC gate electrode (e.g. by an oxide layer formed by tetraethylorthosilicate or by a polysilicon layer)
  Forming of an ILD, formation of contacts and metallization (e.g. deposition and structuring of one or more metal layers to form source and gate metallization).

Summarizing, the reaction Ti+C->TiC may take place at temperatures of more than 1200° C. or more than 1000° C. A carbon layer having a thickness between 100 nm and 300 nm may be formed on a semiconductor substrate (e.g. a silicon substrate or a SiC substrate) and a titanium layer having a thickness between 200 nm and 500 nm may be formed on the carbon layer. The layers may be annealed in an inert atmosphere (e.g. $N_2$ at a temperature of at least 600° C., at least 800° C. and/or at least 1000° C.) to form a TiC layer.

Alternatively, titanium oxide ($TiO_2$) may be formed as an intermediate product. For example, $TiO_2$ may be formed via oxidation (i.e., $Ti+O_2—TiO_2$). Afterwards, TiC may be formed by the reaction $TiO_2+2C->TiC+CO_2$ in an inert atmosphere (e.g. in a nitrogen, $N_2$, atmosphere at a temperature of at least 600° C., at least 800° C. and/or at least 1000° C.). The oxidation may take place in an environment comprising oxygen (so-called oxidating environment), e.g. at a temperature of at least 500° C. and/or at least 700° C. The environment may comprise oxygen. In particular, an amount of oxygen in the environment may be at least an amount required for forming stoichiometric $TiO_2$ (e.g., the amount of oxygen atoms may at least be twice the amount of titanium atoms to be oxidized). In addition to oxygen, the environment may comprise an inert gas (e.g., nitrogen or argon). For example, the environment may be air.

Alternatively, the oxidation may be done by anodic oxidation, for example in water ($H_2O$) or a diluted mineral acid (e.g., phosphoric acid and/or sulfuric acid) as an electrolyte.

For small structural sizes (e.g. pitch minimizing) stripe structures may be used and the use of highly conductive gate electrodes may enable a substantial reduction of chip area due to the omission of otherwise required gate finger structures. Further, the switching behavior may be homogenized across the chip (e.g. due to the lower voltage drop along the stripes in the field plates and gates), which may prevent the occurrence of undesired critical states (e.g. local dynamic avalanches and/or parasitic restart) and thus may enable higher switching frequencies.

More details and aspects are mentioned in connection with the embodiments described above or below. The method shown in FIG. 8 may comprise one or more optional additional features corresponding to one or more aspects mentioned in connection with the proposed concept of one or more embodiments described above or below (e.g. FIGS. 1-7 or 9).

Figure 9:
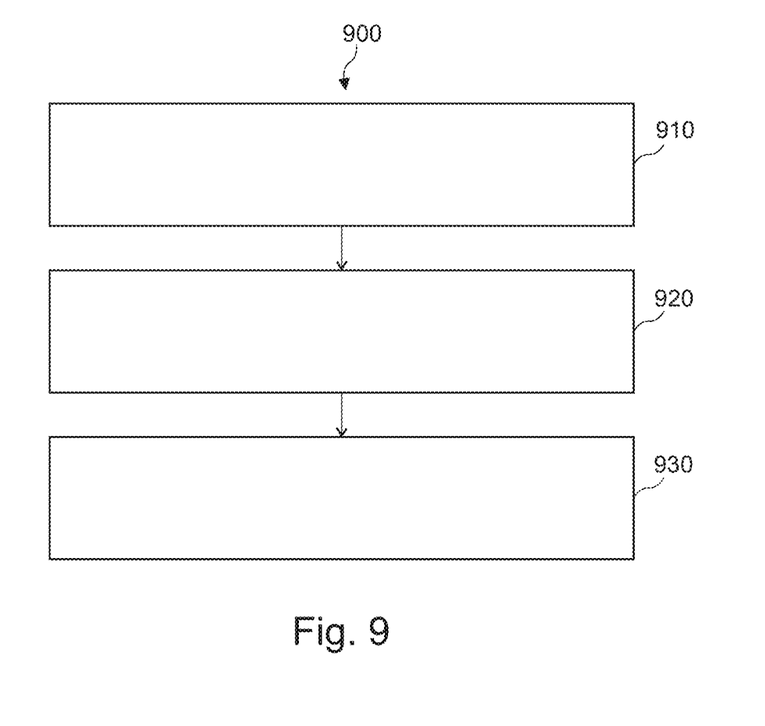
FIG. 9 shows a flow chart of a method for forming a semiconductor device.

FIG. 9 shows a flow chart of a method for forming a semiconductor device according to an embodiment. The method 900 may comprise forming 910 a body region of a transistor cell in a semiconductor substrate and forming 920 a source region of the transistor cell in the semiconductor substrate. Further, the method 900 may comprise forming 930 a titanium carbide field electrode of the transistor cell. The titanium carbide field electrode may be connected or connectable to a reference voltage metallization structure so that a reference voltage independent from a gate voltage of the transistor cell is providable to the titanium carbide field electrode.

To generate a highly conductive field plate and/or gate electrode the use of titanium carbide may be proposed. Titanium carbide has a very good electrical conductivity (e.g. metallic performance and substantially improved electrical conductivity as compared to doped polysilicon) and has a melting point of 3140° C., and it is stable under the influence of air (e.g. oxygen rich atmosphere) up to 800° C.

Due to the high melting point, the subsequent processing might not be subject to any limitations, if the TiC material is encapsulated. When used as a field plate electrode, this might be ensured by the insulation oxide for the gate electrode (for example, deposited tetraethylorthosilicate or high-density plasma oxides may be used). In contrast to the material system titanium nitride and tungsten, subsequent high-temperature processes may be enabled, for example, for the gate insulation layer block (e.g. a SACOX and the actual GOX either as a grown oxide or also as a deposited oxide with a subsequent densification each at temperatures around 1100° C. to ensure a good oxide quality).

Titanium carbide may be deposited by PVD (e.g. titanium methane) and/or CVD (e.g. titanium tetrachloride and methane). Alternatively, a direct synthesis of the two elements may be used by depositing both a carbon layer (for example graphite) and a titanium layer and subsequently generating titanium carbide under the influence of a temperature (e.g. of approximately 900° C.). In order to avoid a possible damage of the oxide by titanium deposition, the carbon layer may be deposited first and subsequently the titanium. Possible titanium residues may be chemically removed (e.g. by sulfuric acid) after the formation of titanium carbide.

As mentioned, the manufacturing of titanium carbide may be done in various possible ways. For example, titanium may be deposited onto an existing carbon layer. To generate thicker titanium carbide layers and simultaneously keep the time in the temperature process low, titanium and carbon may be deposited alternatingly.

For deposition of a carbon layer and a titanium layer, the stoichiometry (e.g. Ti:C~1:1) may be considered. For example, a ratio of the layer thicknesses of Ti:C~2:1 may be required. In the subsequent oven process (e.g. inert, 900° C.-1200° C.) titanium carbide may be formed. Excess titanium may be removed using sulfuric acid.

Alternatively to the reaction of the pure elements, titanium carbide may also be formed from the reaction of titanium dioxide and carbon.

$TiO_2 + 2C \rightarrow TiC + CO_2$

A field plate trench MOSFET may be formed by at least the following processes in the basic order as follows (e.g. any additional intermediate steps may be possible):

Providing a silicon Si substrate with epitaxial layer(s)
Etching the field plate trench and if applicable trench rounding (e.g. using rounding oxide)
Forming field oxide
Forming TiC field plate electrode
Etchback of the field plate electrode
Encapsulation of the field plate electrode with an oxide etc.
Optionally forming a sacrificial oxide
Forming the gate insulation layer
Forming of the TiC gate electrode
Encapsulation of the gate electrode (e.g. by a thin oxide)
Forming of the necessary doping regions (e.g. source region)
Forming ILD
Contact formation and metallization If the TiC field plate electrode and the TiC gate electrode are located in separate trenches, the gate trench may be formed before the formation of the sacrificial oxide. For example, the etchback of the field plate electrode may be optional.

Further, the gate trench may be formed before the field plate trench or vice versa.

Due to the low structural sizes for power devices in the field of low-voltage power MOSFETs (e.g. ≤40V), stripe structures may be used and highly conductive field plates may offer the possibility of a considerable reduction of chip area due to avoiding otherwise required finger structures. Further, the switching behavior may be homogenized across the chip (e.g. due to the lower voltage drop along the stripes in the field plates and gates), which might prevent the occurrence of undesired critical states (e.g. local dynamic avalanches etc.) and thus may enable higher switching frequencies. For example, in the field of CPU voltage regulators these devices may be used in integrated systems and may enable higher power densities.

More details and aspects are mentioned in connection with the embodiments described above or below. The method shown in FIG. 9 may comprise one or more optional additional features corresponding to one or more aspects mentioned in connection with the proposed concept of one or more embodiments described above or below (e.g. FIGS. 1-8).

In at least some embodiments of the silicon carbide devices, the methods and/or the semiconductor devices, the following features (if applicable) apply, alone or in combination:

(i) the TiC gate electrode 130 or at least a TiC layer of the TiC gate electrode 130 comprises TiC as main material;
(ii) the TiC gate electrode 130 or at least a TiC layer of the TiC gate electrode 130 may comprise at least 90% (or at least 95% or at least 99%) TiC;
(iii) the transistor cell is an IGFET cell, a MOSFET cell or an IGBT cell;
(iv) a TiC layer of the TiC gate electrode 130 may be located adjacent to the gate insulation layer and a core region of the gate trench may be filled with another material.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A silicon carbide device, comprising:
   a silicon carbide substrate comprising a body region and a source region of a transistor cell;
   a titanium carbide gate electrode of the transistor cell,
   a gate metallization contacting the gate electrode,
   wherein the gate electrode of the transistor cell is contacted by the gate metallization at no more than two locations;
   wherein for each transistor cell the titanium carbide gate electrodes are connected to the gate metallization structure solely at end regions of the titanium carbide gate electrode, and
   wherein the end regions of the titanium carbide gate electrodes extend from respective lateral ends of the titanium carbide gate electrodes over at most 10% of a length of the respective titanium carbide gate electrode.

2. The silicon carbide device of claim 1, wherein the titanium carbide gate electrode is located in a gate trench, and wherein the gate trench extends from a surface of the silicon carbide substrate into the silicon carbide substrate.

3. The silicon carbide device of claim 2, further comprising a titanium carbide contact electrode located in the gate trench or in a contact trench, wherein the titanium carbide contact electrode is electrically connected to the source region of the transistor cell.

4. The silicon carbide device of claim 2, wherein a width of the gate trench measured at the surface of the silicon carbide substrate is at most 1.5 µtm.

5. The silicon carbide device of claim 1, wherein the transistor cell is a vertical transistor cell configured to conduct current between a front side of the silicon carbide substrate and a backside of the silicon carbide substrate.

6. The silicon carbide device of claim 1, wherein a gate insulation layer is located between the titanium carbide gate electrode and the silicon carbide substrate, wherein the titanium carbide gate electrode comprises at least a layer of titanium carbide adjacent to the gate insulation layer, and wherein the layer of titanium carbide has a thickness of at least 50 nm.

7. The silicon carbide device of claim 1, wherein the transistor cell has a breakdown voltage of more than 300V.

8. A method for forming a silicon carbide device, the method comprising:
   forming a body region of a transistor cell in a silicon carbide substrate;
   forming a source region of the transistor cell in the silicon carbide substrate; and
   forming a titanium carbide gate electrode of the transistor cell, forming a gate metallization contacting the gate electrode such that the gate electrode of the transistor cell is contacted by the gate metallization at no more than two locations,
   wherein for each transistor cell the titanium carbide gate electrodes are connected to the gate metallization structure solely at end regions of the titanium carbide gate electrode, and wherein the end regions of the titanium carbide gate electrodes extend from respective lateral ends of the titanium carbide gate electrodes over at most 10% of a length of the respective titanium carbide gate electrode.

9. The method of claim 8, further comprising forming a gate trench extending from a surface of the silicon carbide substrate into the silicon carbide substrate, wherein the titanium carbide gate electrode is formed in the gate trench.

10. The method of claim 8, wherein forming the titanium carbide gate electrode comprises:
    forming a carbon layer;
    forming at least one of a titanium layer and a titanium oxide layer on the carbon layer; and
    after forming the at least one of the titanium layer and the titanium oxide layer, annealing to form the titanium carbide gate electrode.

11. The method of claim 10, wherein forming the titanium carbide gate electrode further comprises oxidizing the titanium layer before the annealing.

12. The method of claim 11, wherein the oxidizing is performed by an anodic oxidation.

13. The method of claim 10, wherein the annealing is performed at a temperature of at most 1100° C.

14. The method of claim 10, wherein forming the carbon layer and forming the at least one of a titanium layer and a titanium oxide layer is repeated alternatingly to form a layer stack of alternating carbon and at least one of titanium layers and titanium oxide layers.

15. A silicon carbide device, comprising:
    a silicon carbide substrate comprising a body region and a source region of a transistor cell;
    a titanium carbide gate electrode of the transistor cell,
    a gate metallization contacting the gate electrode;
    a plurality of stripe-shaped gate trenches, wherein a titanium carbide gate electrode is located in each stripe-shaped gate trench of the plurality of stripe-shaped gate trenches;
    wherein the gate electrode of the transistor cell is contacted by the gate metallization at no more than two locations
    wherein for each transistor cell the locations at which the gate metallization contacts the gate electrode are not more than 10% of a length of the gate electrode.

* * * * *

UNITED STATES PATENT AND TRADEMARK OFFICE
CERTIFICATE OF CORRECTION

| | |
|---|---|
| PATENT NO. | : 11,342,433 B2 |
| APPLICATION NO. | : 16/693909 |
| DATED | : May 24, 2022 |
| INVENTOR(S) | : R. Siemieniec et al. |

It is certified that error appears in the above-identified patent and that said Letters Patent is hereby corrected as shown below:

In the Claims

Column 18, Line 59 (Claim 15) please change "locations" to -- locations, --

Signed and Sealed this
Ninth Day of August, 2022

Katherine Kelly Vidal
*Director of the United States Patent and Trademark Office*